United States Patent
Minamihaba et al.

(10) Patent No.: US 6,720,250 B2
(45) Date of Patent: Apr. 13, 2004

(54) METHOD OF MANUFACTURING A SEMICONDUCTOR DEVICE USING A SLURRY FOR CHEMICAL MECHANICAL POLISHING OF COPPER

(75) Inventors: Gaku Minamihaba, Kawasaki (JP); Hiroyuki Yano, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/303,855

(22) Filed: Nov. 26, 2002

(65) Prior Publication Data

US 2003/0104699 A1 Jun. 5, 2003

(30) Foreign Application Priority Data

Nov. 30, 2001 (JP) .......................................... 2001-366938

(51) Int. Cl.$^7$ ........................................... H01L 21/4763
(52) U.S. Cl. ................. 438/633 H; 438/672; 438/687; 438/692; 438/693
(58) Field of Search ................................ 438/633, 672, 438/687, 692, 693

(56) References Cited

U.S. PATENT DOCUMENTS

| 6,194,317 | B1 | * | 2/2001 | Kaisaki et al. ............... 438/633 |
| 6,238,592 | B1 | | 5/2001 | Hardy et al. ................. 438/692 |
| 6,436,830 | B1 | | 8/2002 | Merchant et al. ........... 438/692 |
| 6,454,819 | B1 | | 9/2002 | Yano et al. .................. 438/692 |
| 6,458,289 | B1 | | 10/2002 | Merchant et al. ........... 438/692 |

FOREIGN PATENT DOCUMENTS

| JP | 2001-110759 | 4/2001 |
| JP | 2001-269860 | 10/2001 |

* cited by examiner

Primary Examiner—Lynne A. Gurley
(74) Attorney, Agent, or Firm—Finnegan, Henderson, Farabow, Garrett & Dunner, L.L.P.

(57) ABSTRACT

A method of manufacturing a semiconductor device using a polishing slurry for CMP of Cu, which includes a first complexing agent containing a heterocyclic compound which is capable of forming a water-insoluble complex with Cu, and a second complexing agent containing a heterocyclic compound which is capable of forming a slightly water-soluble or water-soluble complex with Cu to thereby provide at least one extra ligand subsequent to formation of the complex.

11 Claims, 3 Drawing Sheets

METHOD OF MANUFACTURING A SEMICONDUCTOR DEVICE USING A SLURRY FOR CHEMICAL MECHANICAL POLISHING OF COPPER

CROSS-REFERENCE TO RELATED APPLICATIONS

This application is based upon and claims the benefit of priority from the prior Japanese Patent Application No. 2001-366938, filed on Nov. 30, 2001; the entire contents of which are incorporated herein by reference.

BACKGROUND OF THE INVENTION

1. Field of the Invention

The present invention relates to a slurry for CMP (Chemical Mechanical Polishing) of copper and to a method of manufacturing a semiconductor device by making use of the slurry. In particular, the present invention relates to formation of a damascene wiring of copper, which is designed to be employed in a DRAM or a high-speed logic LSI.

2. Description of the Related Art

In recent years, attention has been drawn to the employment of copper as a wiring material for LSI. Since the working of a Cu layer by means of RIE (Reactive Ion Etching) is accompanied with difficulties, the working of a Cu layer has been generally performed by making use of a damascene wiring-forming method where the CMP method (Chemical Mechanical Polishing Method) is employed.

The working by means of chemical CMP is performed as follows. Namely, a protective film made of an oxide or an organic compound (an organic Cu complex) is formed by chemical reaction on the surface of a Cu layer, and then, the Cu layer is polished while the surface of the Cu layer is protected by this protective film. Therefore, the performance of the working by means of CMP is greatly influenced by the characteristics of the protective film to be employed. Namely, a protective film made of an organic Cu complex which is excellent in flexibility is more preferable than a protective film made of a Cu oxide or an inorganic material in that the polishing rate of Cu layer is relatively high and the erosion of Cu layer can be minimized. Incidentally, if it is desired to form the protective film on the surface of a Cu layer by making use of an organic Cu complex, it can be realized by incorporating a complexing agent which is capable of forming the organic Cu complex into a polishing slurry.

However, the method of forming the protective film made of the organic Cu complex is accompanied with the problem that the resultant protective film is hydrophobic because of the fact that the protective film is formed of an organic material. If the protective film is hydrophobic, it will give rise to instability of the performance of CMP. For example, since residual abrasion dust (residual dust created from the polishing) of the organic Cu complex is hydrophobic, it is not dissolved in a polishing slurry, so that residual abrasion dust is caused to accumulate in a polishing pad. If this residual abrasion dust is accumulated in the polishing pad, the polishing rate of a Cu layer is considerably decreased.

Further, since the surface of a Cu layer being polished is also hydrophobic, residual abrasion dust is caused to adhere onto the surface of the Cu layer. Further, since the Cu layer is polished in the presence of residual abrasion dust, scratches are caused on the surface of the Cu layer.

Therefore, it is required that the protective film made of an organic Cu complex is made hydrophilic. It is conceivable to incorporate a surfactant into the complexing agent in order to hydrophilize the protective film formed of an organic Cu complex. However, if the surfactant is formed of an ionic surfactant, the surfactant may react with Cu to form a compound, or be adsorbed onto the particles in the polishing slurry, thereby deteriorating the performance of CMP. On the other hand, if the surfactant is formed of a nonionic surfactant, the surfactant may be prevented from forming a complex with Cu, thus allowing the surfactant to adsorb onto a hydrophobic organic complex that may be formed through the reaction between Cu and the complexing agent, thereby improving, to some extent, the hydrophilicity of the protective film. However, since the magnitude of hydrophilization of the protective film is insufficient in this case, the effect obtained from this hydrophilization of the protective film would be negligible.

BRIEF SUMMARY OF THE INVENTION

According to a first aspect of the present invention, there is provided a polishing slurry for CMP of Cu, which comprises a first complexing agent containing a heterocyclic compound which is capable of forming a water-insoluble complex with Cu; and a second complexing agent containing a heterocyclic compound which is capable of forming a slightly water-soluble or water-soluble complex with Cu to thereby provide at least one extra ligand subsequent to formation of the complex.

According to a second aspect of the present invention, there is also provided a method of manufacturing a semiconductor device, which comprises:

forming a groove and/or a hole in an insulating film formed above a surface of a substrate;

depositing a copper film on a surface of the insulating film to thereby bury the groove and/or the hole with the copper film; and polishing the copper film by making use of a polishing slurry comprising a first complexing agent containing a heterocyclic compound which is capable of forming a water-insoluble complex with Cu; and a second complexing agent containing a heterocyclic compound which is capable of forming a slightly water-soluble or water-soluble complex with Cu to thereby provide at least one extra ligand subsequent to the formation of the complex, thereby filling the groove and/or the hole with the polishing slurry and removing the portion of the copper film which is deposited on the insulating film formed outside of the groove and/or hole.

DETAILED DESCRIPTION OF THE INVENTION

Figure 1A:
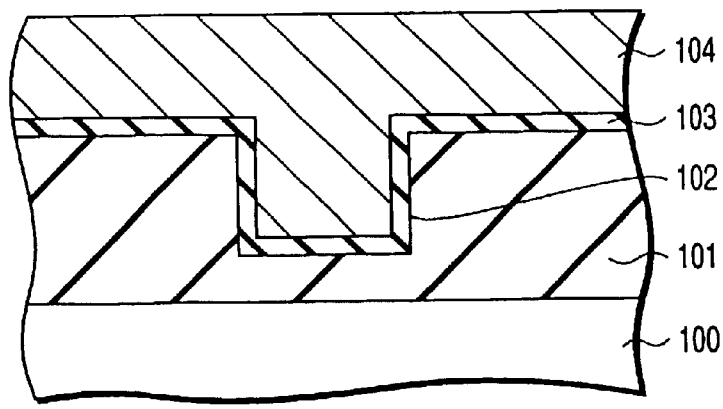
FIGS. 1A to 1C are cross-sectional views each illustrating stepwise the process for forming a Cu damascene wiring according to one example of the present invention.

The slurry for CMP of copper according to one embodiment of the present invention comprises a first complexing agent containing a heterocyclic compound which is capable of forming a water-insoluble complex with Cu; and a second complexing agent containing a heterocyclic compound which is capable of forming a slightly water-soluble or water-soluble complex with Cu to thereby provide at least one extra ligand subsequent to formation of the complex.

It is preferable in the polishing slurry according to one embodiment of the present invention that a mixing ratio of the first complexing agent to the second complexing agent falls within the range of 2:8 to 8:2 based on weight, more preferably within the range of 4:6 to 6:4 based on weight.

If the content of the first complexing agent is larger than the upper limit of the aforementioned mixing ratio (or the content of the second complexing agent is smaller than the lower limit of the aforementioned mixing ratio), scratches may be generated on the surface of the Cu layer due to the effect of insoluble residual abrasion dust, and more over, the polishing rate may also be deteriorated. On the other hand, if the content of the first complexing agent is smaller than the lower limit of the aforementioned mixing ratio (or the content of the second complexing agent is larger than the upper limit of the aforementioned mixing ratio), erosion may occur on the surface of the Cu layer.

The first complexing agent contains a heterocyclic compound which is capable of forming a water-insoluble complex with Cu. This heterocyclic compound is either hydrophobic in itself or formed of a water-insoluble complex where all of hydrophilic ligands that may happen to be included therein are coordinately bonded to Cu. Specific examples of such a heterocyclic compound include quinaldinic acid, benzotriazole, 7-hydroxy-5-methyl-1,3,4-triazaindolizine, etc. Among these heterocyclic compounds, the employment of quinaldinic acid and benzotriazole is more preferable.

The second complexing agent contains a heterocyclic compound which is capable of forming a slightly water-soluble or water-soluble complex with Cu to thereby provide at least one extra ligand subsequent to the formation of the complex. In this heterocyclic compound, one or more ligands among a plurality of ligands are prevented from being bonded to Cu and hence left free as extra ligands. Specific examples of such heterocyclic compounds include quinolinic acid (pyridine-2,3-dicarboxylic acid), nicotinic acid (pyridine-3-dicarboxylic acid), cinchomeronic acid (pyridine-3,4-dicarboxylic acid), pyridine-2,3,4-dicarboxylic acid, tryptophan, phenylglycine, biguanide, etc.

Among these heterocyclic compounds, the employment of quinolinic acid (pyridine-2,3-dicarboxylic acid), nicotinic acid (pyridine-3-dicarboxylic acid), cinchomeronic acid (pyridine-3,4-dicarboxylic acid), pyridine-2,3,4-dicarboxylic acid are more preferable.

Incidentally, it is possible to obtain an optimum result by employing these heterocyclic compounds in such a manner that quinaldinic acid is employed as the first complexing agent, quinolinic acid is employed as the second complexing agent, and quinaldinic acid is mixed with quinolinic acid at a mixing ratio ranging from 4:6 to 6:4 based on weight.

According to one embodiment of the present invention, the heterocyclic compounds forming the aforementioned first and second complexing agents may be selected from a five-membered ring and a six-membered ring, each containing heteroatom such as N, S, O, etc. The ligands may be those having a functional group, such as a carboxylic group, amino group, sulfone group, etc.

The polishing slurry according to one embodiment of the present invention may contain, in addition to the aforementioned first and second complexing agents, an oxidizing agent, a polishing particle, a polishing rate-promoting agent, a surfactant, etc. The specific examples of the oxidizing agent are persulfuric acid, ammonium persulfate and hydrogen peroxide. Specific examples of the polishing particle are silica, alumina, zirconia and ceria. Specific examples of the polishing rate-promoting agent are glycine and alanine. As for the surfactant, the employment of a low molecular weight surfactant having a molecular weight of no more than 100 is preferable. The surfactant may be cationic, anionic or nonionic.

More specifically, the cationic or anionic surfactant should preferably be selected from those having a benzene ring, specific examples thereof being potassium dodecylbenzenesulfonate, ammonium dodecylbenzenesulfonate, etc. The nonionic surfactant should preferably be selected from those having a HLB value of 20 or less, specific examples thereof being acetylene diol-based nonion, perfluoroalkyl ethylene oxide adduct, etc.

Further, according to another embodiment of the present invention, there is provided a method of manufacturing a semiconductor device, which comprises forming a groove and/or a hole in an insulating film formed above a surface of a substrate; depositing a copper film on a surface of said insulating film thereby burying the groove and/or the hole with the copper film; and polishing said copper film by making use of the aforementioned polishing slurry, thereby filling the groove and/or the hole with the copper film and, at the same time, removing the portion of the copper film which is deposited on the insulating film formed outside of the groove and hole.

The principle of one embodiment of the present invention will be explained as follows.

The polishing slurry according to one embodiment of the present invention comprises a first complexing agent containing a heterocyclic compound which is capable of forming a water-insoluble complex with Cu. This first complexing agent is capable of forming a water-insoluble complex with Cu as soon as the polishing slurry is applied to the surface of the copper layer to be polished, to thereby provide a film to be functioned as a protective film on the occasion of the polishing.

Further, the polishing slurry according to one embodiment of the present invention comprises a second complexing agent containing a heterocyclic compound which is capable of forming a slightly water-soluble or water-soluble complex with Cu to thereby provide at least one extra ligand subsequent to the formation of the complex. This second complexing agent is capable of forming a slightly water-soluble or water-soluble complex with Cu as soon as the polishing slurry is applied to the surface of copper layer constituting the surface to be polished. Namely, all of the ligands of the heterocyclic compound are not coordinately bonded to Cu, but at least one of the ligands is left free as an extra ligand (or ligands), thereby allowing this extra ligand (or ligands) to exhibit hydrophilicity, thus giving a slightly water-soluble or water-soluble complex.

This slightly water-soluble or water-soluble complex is not enabled to instantly dissolve into the polishing slurry, but is allowed to take a state where this slightly water-soluble or water-soluble complex is impregnated into the protective film formed of the aforementioned water-insoluble complex. Namely, although a protective film is formed through a cooperative action between the first complexing agent and the second complexing agent, this protective film is made hydrophilic due to the effect of the second complexing agent.

Figure 5:
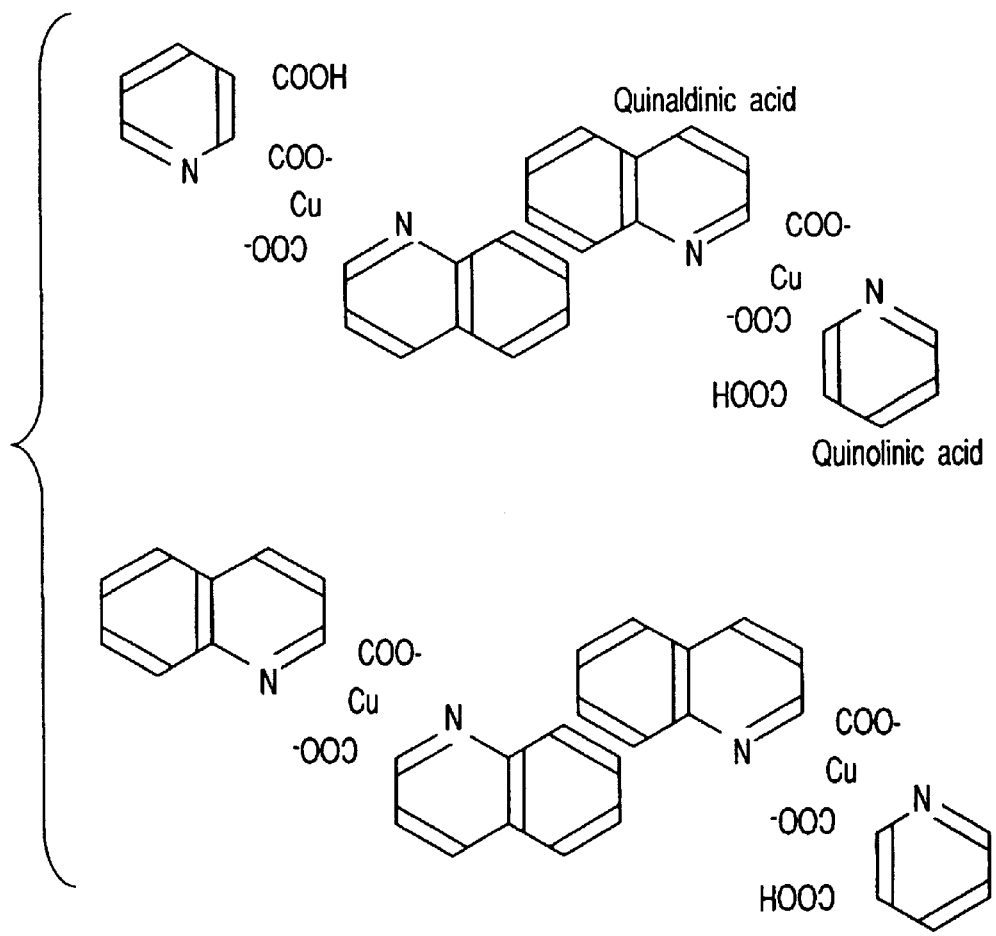
FIG. 5 illustrates the chemical formula of the Cu complex constituting the protective film which has been formed on the occasion of the polishing step using a polishing slurry according to one embodiment of the present invention.

FIG. 5 illustrates the chemical formula representing the chemical structure of the Cu complex which has been formed using quinaldinic acid as the first complexing agent, and quinolinic acid as the second complexing agent. Namely, as shown in FIG. 5, two kinds of complexes, i.e., a complex where both of quinaldinic acid and quinolinic acid are coordinately bonded to Cu, and a complex where only quinaldinic acid is coordinately bonded to Cu are mixedly included in the protective film.

When a Cu layer is polished by making use of the aforementioned polishing slurry, the surface of the copper layer can be protected from erosion owing to the existence of the organic protective film formed of a complex comprising copper. Further, since this organic protective film is made hydrophilic, residual abrasion dust can dissolve in the polishing slurry without being accumulated on the polishing pad or adhering to the surface of the copper layer. As a result, the polishing pad is prevented from being colored, and at the same time, the surface of the copper layer is prevented from the generation of scratches.

Moreover, because of the fact that both of the first complexing agent and the second complexing agent contain a heterocyclic compound, the protective film is formed by way of the physical adsorption between hydrophobic sites of the heterocyclic skeletons. The protective film thus formed is higher in Cu-polishing speed and smaller in magnitude of erosion as compared with the protective film formed of a methyl group or linear hydrophobic site.

Next, various examples of the present invention will be explained with reference to drawings.

EXAMPLE 1

Figure 1B:
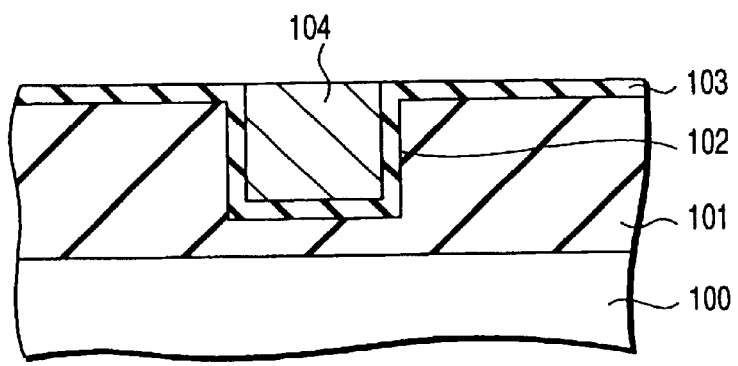
Figure 1C:
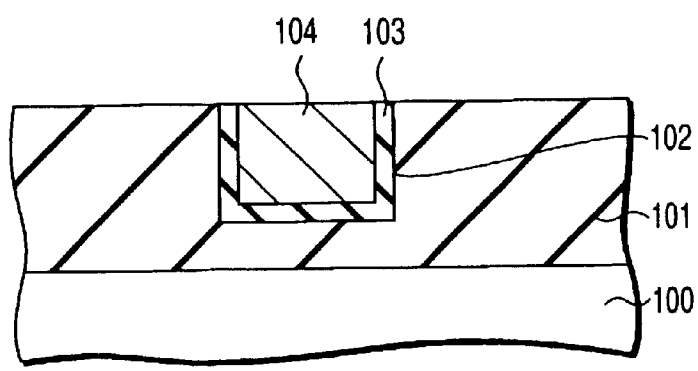

FIGS. 1A to 1C are cross-sectional views each illustrating, stepwise, the process for forming a Cu damascene wiring according to this example.

First of all, as shown in FIG. 1A, an insulating film 101 formed above a silicon wafer 100 provided with semiconductor elements formed therein was etched to form a pattern of a groove 102 having a depth of 1 $\mu$m. Then, a TaN liner 103 having a thickness of 100 angstroms was deposited on the insulating film 101 provided with the groove 102. Thereafter, a Cu film 104 having a thickness of 2 $\mu$m was deposited on the surface of TaN liner 103 to thereby fill the groove 102 with the Cu film 104. Incidentally, the Cu film 104 was formed in such a manner that a seed layer was formed at first by means of sputtering method, and then, the Cu film 104 was formed on this seed layer by means of plating method.

Then, the surface of the Cu film 104 was subjected to a CMP treatment to remove the Cu film 104 that was deposited on the insulating film 101 existing outside the groove 102. In order to assess the stability of the CMP, the CMP treatment was continuously performed on 50 sheets of wafers.

As for the polishing slurry, a slurry having the following composition was employed.

Quinaldinic acid (the first complexing agent): 0.2 wt %;
Quinolinic acid (the second complexing agent): 0.3 wt %;
Ammonium persulfate (oxidizing agent): 1.5 wt %;
Colloidal silica (polishing particle): 1 wt %;
Glycine (polishing rate-promoting agent): 0.3 wt %;
Potassium dodecylbenzene sulfonate (surfactant): 0.05 wt %;
Acetylene diol-based nonion surfactant (surfactant): 0.1 wt %.

Incidentally, KOH was incorporated as an additional component into the aforementioned composition thereby obtaining an aqueous dispersion where the pH thereof was controlled to 9.2.

The polishing was performed according to the following conditions.

Flow rate: 300 cc/min;
Polishing pad: IC1000 (tradename; Rodel Co., Ltd.);
Load: 400 gf/cm2.
Revolution speed of carrier and turntable: 100 rpm;

The polishing time was determined by detecting the descending point in the current of the motor of the turntable, and the wafers were over-polished for a period of time wherein after the polishing time when part of the polishing pad was enabled to reach the TaN film 103 (the time when the TaN film 103 was partially exposed), the polishing was further continued for an additional period of time which corresponded to 30% of the last mentioned polishing time.

As a result, the structure as shown in FIG. 1B where the groove 102 was filled with the Cu film 104 was obtained.

As a comparative example, the Cu film 104 was polished by making use of the same polishing slurry and under the same conditions as those of Example 1, except that quinolinic acid was not included in the slurry and only quinaldinic acid was included therein at a ratio of 0.5 wt %.

Figure 2:
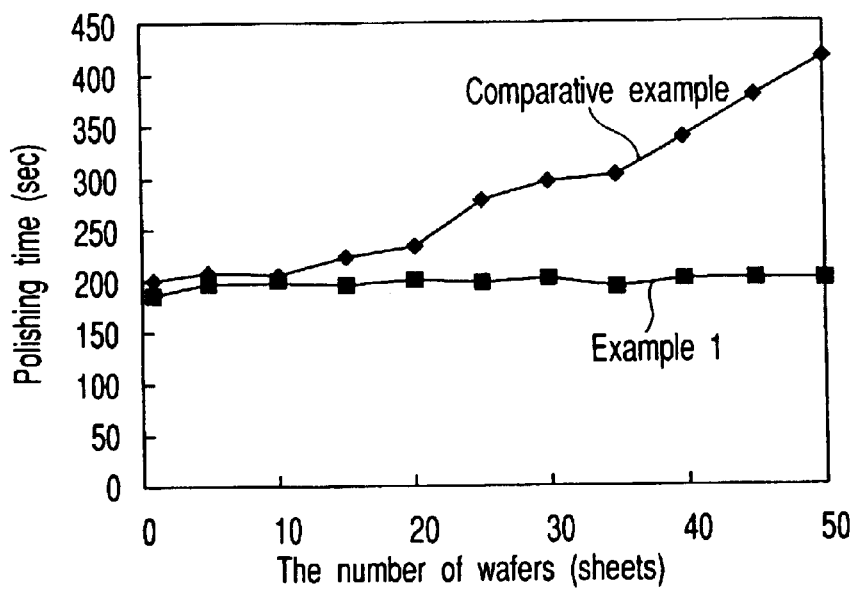
FIG. 2 is a graph illustrating the relationship between the polishing time and the number of wafers that have been treated in Example 1 and in the Comparative Example.

FIG. 2 shows the relationship between the polishing time and the number of wafers subjected to the polishing treatment in Example 1 and in the comparative example. As shown in FIG. 2, in the case of the comparative example where a polishing slurry containing only quinaldinic acid was included therein as a complexing agent, there was recognized the tendency that the polishing time was gradually increased as the polishing was continued exceeding over the tenth wafer. Whereas in the case of Example 1 where a polishing slurry containing not only quinaldinic acid but also quinolinic acid were included therein as a completing agent, all 50 sheets of wafers were enabled to be polished within an approximately constant polishing time.

Further, the surface of each of the wafers was observed with respect to any defects, thus assessing the quality of the wafers. As a result, scratches were observed at a ratio of 100 scratches/wafer in the case of the comparative example. Whereas, in the case of Example 1, no scratches were found, i.e. 0 scratch/wafer. In the case of Example 1, further, there was no corrosion.

Further, in the case of the comparative example, the polishing pad was colored blue, thus indicating the fact that the residual abrasion dust of the Cu complex was accumulated on the surface of the polishing pad. Whereas in the case of Example 1, the polishing pad was not colored at all, thus indicating the fact that the residual abrasion dust was dissolved in the polishing slurry. It was assumed that the residual abrasion dust was enabled to smoothly discharge outside the polishing pad.

Incidentally, if only quinolinic acid (0.5 wt %) was employed as a complexing agent without employing quinaldinic acid, only a hydrophilic Cu complex would be created, thereby allowing the protective film to dissolve in the polishing slurry, thus giving rise to the generation of erosion.

Figure 3:
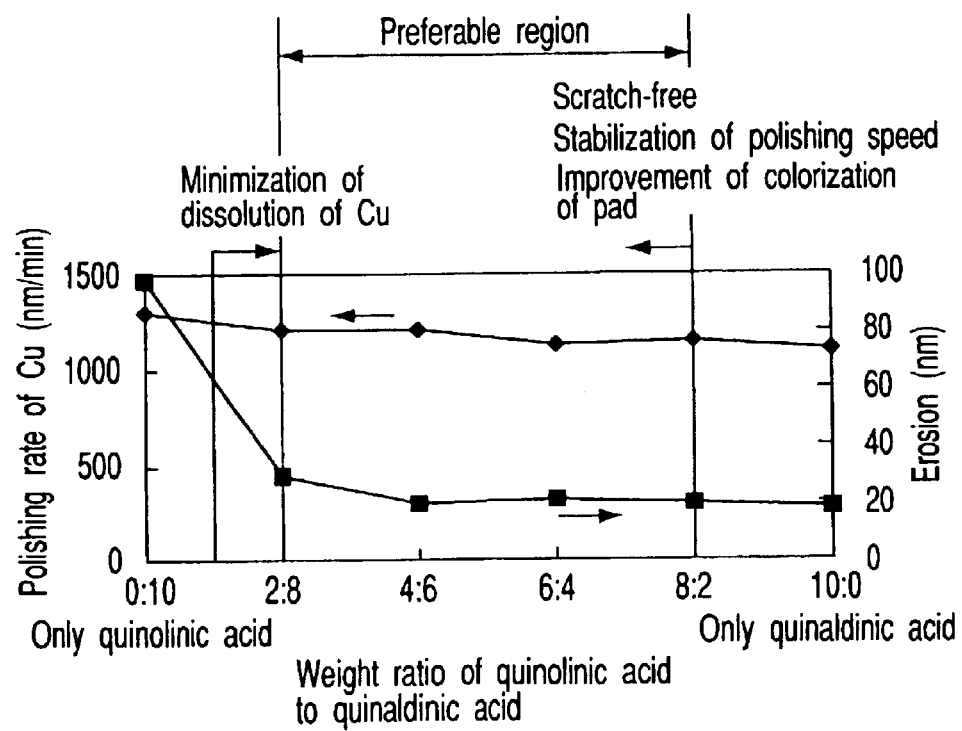
FIG. 3 is a graph illustrating the results measured of the polishing rate of the Cu layer and of the magnitude of erosion of the Cu layer, both of which are obtained while changing the mixing ratio of quinaldinic acid to quinolinic acid.

Next, the mixing ratio of quinaldinic acid to quinolinic acid was varied to measure the polishing speed and erosion of Cu. Additionally, observation was performed with respect to the generation of scratches on the surface of the wafer, to the coloration of the polishing pad, to the stability of polishing speed, and to the solubility of the protective film. As a result of total examination on these features, it was found as shown in FIG. 3 that the mixing ratio (based on weight) between quinaldinic acid and quinolinic acid should preferably be within the range of 2:8 to 8:2.

When the mixing ratio (based on weight) between quinaldinic acid and quinolinic acid is controlled within the range of 2:8 to 8:2 as mentioned above, it was possible to obtain various advantages that the polishing speed of Cu could be made 1000 nm/min or more, that the magnitude of erosion (the width of wiring: 50 $\mu$m) could be suppressed to <30 nm, that the polishing stability could be improved, and that high-quality polishing where the surface of wafer was free from the generation of any defects could be achieved.

Finally, the exposed portion of the TaN liner 103 which was deposited on the surface of the insulating film 101 was removed by means of polishing thereby obtaining a Cu damascene wiring having the structure as shown in FIG. 1C where the groove 102 was filled with the Cu film 104.

The removal of the TaN liner 103 was performed using CMS 8301 (JSR Co., Ltd.) under the polishing conditions as shown below.

Flow rate of slurry: 200 cc/min;
Polishing pad: IC1000 (Rodel Co., Ltd.);
Load: 222 gf/cm2.
Revolution speed of carrier and turntable: both 100 rpm;
Polishing time: 2 minutes.

EXAMPLE 2

The polishing of Cu was performed in the same manner as described in Example 1 except that the feeding of the polishing slurry was performed by way of a two-liquid method, thereby obtaining a Cu damascene wiring.

As for the oxidizing agent to be incorporated into the polishing slurry, persulfuric acid or hydrogen peroxide, both of which are fairly strong in oxidizing power, can be generally employed. However, these oxidizing agents may oxidize and decompose other components of the slurry such as the complexing agent.

Therefore, in this example, the solution containing an oxidizing agent was separated at first from the solution containing the components of slurry that may be decomposed by the oxidizing agent, and these solutions were mixed together immediately before the polishing step.

Figure 4:
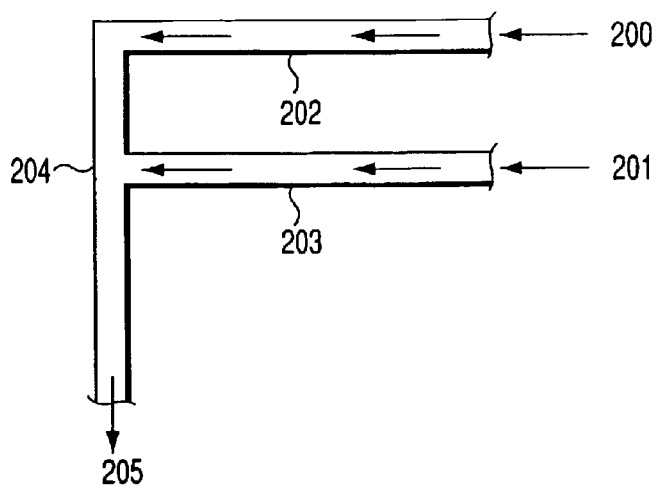
FIG. 4 is a diagram illustrating the method of feeding two kinds of liquids where an F-shaped feed nozzle is employed according to another example of the present invention.

More specifically, the polishing slurry employed in Example 1 was separated into two kinds of solution, i.e. an oxidizing agent (ammonium persulfate)-containing solution 200, and another solution 201 containing other kinds of components. These solutions were separately supplied by way of separate nozzles 202 and 203 of an F-shaped two-liquid type feed nozzle as shown in FIG. 4, and joined together to produce a mixed slurry 205 immediately before the slurry was applied to the sample body to be polished (polishing body), and the resultant mixed slurry 205 was applied to the surface of Cu film by way of a single feed nozzle 204. As a result, it was possible to perform the feeding of the polishing slurry without inviting the decomposition of other components by the effect of the oxidizing agent.

Incidentally, since a hydrophobic complexing agent such as quinaldinic acid is low in solubility in water, it is difficult to enable it to readily dissolve in an oxidizing agent-containing solution and hence difficult to enable it to exhibit a stable polishing performance. By contrast, according to the present example, a complexing agent having a large number of hydrophilic sites, such as quinolinic acid, is employed, so that it is possible to enable the complexing agent to readily dissolve in an oxidizing agent-containing solution even if they are joined together immediately before the application thereof to a polishing body and hence possible to enable it to exhibit a stable polishing performance.

When the polishing of the Cu film was performed by feeding a polishing slurry containing only quinaldinic acid as a complexing agent and by making use of the F-shaped two-liquid type feed nozzle as shown in FIG. 4, abnormal polishing of the Cu film where the Cu film could not be polished at all frequently occurred. By contrast, in the case of Example 2 where both of quinaldinic acid and quinolinic acid were included as a complexing agent in the polishing slurry, such an abnormal polishing as mentioned above was not found, and it was possible to obtain excellent polishing stability and polishing performance in the same manner as obtained where the polishing slurry was fed as a single liquid.

EXAMPLE 3

The polishing of Cu was performed in the same manner as described in Example 1 except that a polishing slurry having the following composition was employed.

Benzotriazole (the first complexing agent): 0.05 wt %;
Pyridine-2,3,4-dicarboxylic acid (the second complexing agent): 0.2 wt %;
Ammonium persulfate (oxidizing agent): 2 wt %;
Alumina (polishing particle): 1 wt %;
Alanine (polishing rate-promoting agent): 0.4 wt %;
Potassium dodecylbenzene sulfonate (surfactant): 0.05 wt %;
Perfluoroalkylethylene oxide (surfactant): 0.1 wt %.

Incidentally, KOH was incorporated as an additional component into the aforementioned composition to thereby obtain an aqueous dispersion where the pH thereof was controlled to 9.2.

As a result, it was possible to perform the polishing in such manners that the polishing speed of Cu was 1000 nm/min, that the magnitude of erosion (the width of wiring: 50 $\mu$m) was suppressed to <30 nm, that the polishing stability was improved, and that high-quality polishing where the surface of the wafer was free from the generation of any defects was achieved.

According to the foregoing examples, quinaldinic acid or benzotriazole was employed as the first complexing agent, and quinolinic acid or Pyridine-2,3,4-dicarboxylic acid was employed as the second complexing agent. However, the present invention is not limited to these heterocyclic compounds, but various kinds of heterocyclic compounds can be employed in obtaining the effects to be achieved by the present invention.

As explained above, it is possible, according to one embodiment of the present invention, to provide a polishing slurry for CMP of copper, which is capable of accelerating the polishing speed, capable of preventing the generation of erosion, capable of obtaining excellent polishing stability, and capable of performing high-quality polishing without inviting the generation of defects on the surface of the wafer.

Further, it is also possible, by making use of this polishing slurry, to manufacture a semiconductor device which is provided with a Cu damascene wiring and excellent in accuracy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, which comprises:

forming a groove and/or a hole in an insulating film formed above a surface of a substrate;

depositing a copper film above a surface of said insulating film to thereby bury said groove and/or said hole with said copper film; and polishing said copper film by making use of a polishing slurry comprising a first complexing agent containing a heterocyclic compound which is capable of forming a water-insoluble complex with Cu; and a second complexing agent containing a heterocyclic compound which is capable of forming a slightly water-soluble or water-soluble complex with Cu to thereby provide at least one extra ligand subsequent to formation of the complex, with a protective film being formed on the copper film, said protective film containing a first complex wherein the first and second complexing agents are coordinately bonded to copper, and a second complex wherein only the first complexing agent is coordinately bonded to cooper, thereby filling said groove and/or hole with said copper film and removing the portion of said copper film which is deposited above said insulating film formed outside of said groove and/or hole.

2. The method according to claim 1, wherein a mixing ratio of said first complexing agent to said second complexing agent is within the range of 2:8 to 8:2 based on weight.

3. The method according to claim 1, wherein a mixing ratio of said first complexing agent to said second complexing agent is within the range of 4:6 to 6:4 based on weight.

4. The method according to claim 1, wherein said first complexing agent is at least one selected from the group consisting of quinaldinic acid and benzotriazole.

5. The method according to claim 1, wherein said second complexing agent is at least one acid selected from the group consisting of quinolinic acid, nicotinic acid, cinchomeronic acid and pyridine-2,3,4-dicarboxylic acid.

6. The method according to claim 1, wherein said first complexing agent is quinaldinic acid, and said second complexing agent is quinolinic acid, said quinaldinic acid being mixed with said quinolinic acid at a mixing ratio ranging from 4:6 to 6:4 based on weight.

7. The method according to claim 1, wherein said polishing slurry further comprises an oxidizing agent selected from the group consisting of persulfuric acid, ammonium persulfate and hydrogen peroxide.

8. The method according to claim 1, wherein said polishing slurry further comprises polishing particles comprising a material selected from the group consisting of silica, alumina, zirconia and ceria.

9. The method according to claim 1, wherein said polishing slurry further comprises a polishing rate promoting agent selected from the group consisting of glycine and alanine.

10. The method according to claim 1, wherein said polishing slurry further comprises a surfactant.

11. The method according to claim 1, wherein said first complexing agent is quinaldinic acid, and said second complexing agent is quinolinic acid.

* * * * *